United States Patent [19]

Weigel

[11] E Re. 29,786

[45] Reissued Sep. 26, 1978

[54] COMBINED 82-POSITION UHF AND VHF TELEVISION TUNER WITH MEMORY FINE TUNING

[75] Inventor: Morton L. Weigel, Bloomington, Ind.

[73] Assignee: Sarkes Tarzian, Inc., Bloomington, Ind.

[21] Appl. No.: 768,102

[22] Filed: Feb. 14, 1977

Related U.S. Patent Documents

Reissue of:

[64] Patent No.: 3,973,229
Issued: Aug. 3, 1976
Appl. No.: 537,841
Filed: Jan. 2, 1975

[51] Int. Cl.[2] ..... H03J 1/02; H03J 3/12

[52] U.S. Cl. ..... 334/86; 74/10.41; 74/10.6; 74/10.8; 334/87; 334/88

[58] Field of Search ..... 334/50, 51, 86, 87, 334/88; 74/10.41, 10.6, 10.8, 10.51

[56] References Cited

U.S. PATENT DOCUMENTS

| | | | |
|---|---|---|---|
| 3,196,695 | 7/1965 | Dotto | 334/51 X |
| 3,251,234 | 5/1966 | Valettard | 334/51 X |
| 3,364,753 | 1/1968 | Bidlack | 334/51 X |
| 3,593,226 | 7/1971 | Weigel | 334/50 |
| 3,824,507 | 7/1974 | Speer et al. | 334/47 |
| 3,842,683 | 10/1974 | Valdettaro | 334/47 |
| 3,916,820 | 11/1975 | Valdettaro | 334/86 |

*Primary Examiner*—Saxfield Chatmon, Jr.
*Attorney, Agent, or Firm*—Mason, Kolehmainen, Rathburn & Wyss

[57] ABSTRACT

A combination UHF and VHF television tuner having a single detented selector shaft for individually selecting each one of the 82 UHF and VHF television channels and a single fine tuning shaft for providing memory fine tuning of channels in both the UHF and VHF bands. A single digital type channel indicator is used for precisely displaying at a single location the channel number of the UHF or VHF channel selected by the common selector shaft.

23 Claims, 12 Drawing Figures

COMBINED 82-POSITION UHF AND VHF TELEVISION TUNER WITH MEMORY FINE TUNING

Matter enclosed in heavy brackets [ ] appears in the original patent but forms no part of this reissue specification; matter printed in italics indicates the additions made by reissue.

*CROSS-REFERENCE TO RELATED APPLICATION*

*This application is a reissue of U.S. Pat. No. 3,973,229, which issued on Aug. 3, 1976 to the present applicant.*

BACKGROUND OF THE INVENTION

This invention relates generally to tuners, and more particularly, to a combined UHF and VHF television tuner utilizing a single selector shaft for selecting all of the 82 UHF and VHF television channels, a single fine tuning shaft and a single indicator for displaying each of the individual UHF and VHF channel numbers.

Several combined UHF and VHF television tuners are known. In certain prior art combination tuners, two separate selector shafts, one for selecting the UHF channels and the other for selecting the VHF channels, are used. In other such tuners a single selector shaft is employed for selecting channels in both the UHF and VHF bands. Both memory and non-memory type fine tuning mechanisms have been used, and single and multiple fine tuning shafts have been utilized for driving the fine tuning mechanisms. In addition, both single and multiple indicators have been employed to display the number of the channel selected by the appropriate selector shaft.

Whereas these tuners provide a way to select both UHF and VHF television channels, the use of multiple selector and fine tuning shafts is not entirely satisfactory because it results in an inconvenience to the user when switching between UHF and VHF bands. In addition, the operation and feel of the two tuning shafts is generally sufficiently different that the user has to learn two different tuning techniques for tuning the channels from the two different bands. The use of two separate tuning shafts also usually requires the use of two separate channel indicators, because the use of a single indicator controlled by two separate shafts would tend to confuse the operator as to which of the selector shafts to turn to obtain a change in channels. In the alternative, a complex and expensive switching and lighting arrangement is required to inform the operator which turning shaft is being displayed. Also, the Federal Communications Commission requirement that UHF tuners be compatible in all respects with VHF tuners must be met, preferably without materially increasing the overall cost of the combination tuner.

Combination tuners utilizing a single selector shaft have generally been provided with a predetermined, relatively small number of UHF positions for selecting preselected ones of the UHF channels. The aforementioned UHF positions may be interleaved between the VHF positions or may be positioned at one end of the tuning range. While such an approach does simplify the tuning procedure, it requires the customer to add on a tag or label indicating the channel numbers of the television stations the user wishes to receive in his area if a unique channel number indication is to be provided as the UHF stations are selected. Also, with such an approach the number of available UHF positions is limited, thereby limiting the number of UHF stations that can be selected. Furthermore, the UHF channel positions are not generally arranged in a continuous numerical sequence of channel numbers, particularly when the interleaved UHF and VHF approach is used.

Accordingly, it is an object of the present invention to provide a new and improved combination UHF and VHF tuner.

It is yet another object of the present invention to provide a combined UHF and VHF tuner having a single detented selector shaft capable of uniquely and sequentially selecting each channel in both of the UHF and VHF bands.

Another object of the present invention is to provide an improved combination UHF and VHF television tuner wherein the tuning of the UHF and VHF bands is operationally so similar that both the UHF and VHF channels may be selected by an operator using a single tuning technique.

Still another object of the present invention is to provide an improved combination UHF and VHF television tuner having a channel indicator that sequentially displays a unique channel number for each station in the UHF band and each station in the VHF band.

A further object of the present invention is to provide an improved UHF and VHF television tuner utilizing a single fine tuning shaft for memory fine tuning both the UHF and VHF channels.

In accordance with a preferred embodiment of the invention, a continuously tunable UHF tuner is provided with a detenting mechanism and a detented selector shaft for rendering the UHF tuner incrementally tunable between detent positions with each detent position corresponding to a single distinct UHF television channel, thereby making the tuner of the UHF tuner similar to that of a standard VHF tuner.

A standard detented VHF tuner is mounted adjacent to the UHF tuner, and a gear mechanism is utilized to couple the selector shaft and the tuning shaft of the VHF tuner to permit the VHF tuner to be driven by the same selector shaft that drives the UHF tuner. A disengaging mechanism responsive to the position of the selector shaft is utilized to disengage the gear mechanism to decouple the VHF tuner from the selector shaft when the common selector shaft is rotated into the UHF range.

The UHF tuner is provided with a plurality of cams disposed about a rotatable turret for providing a memory type fine tuning in the UHF band. A single fine tuning shaft is coupled to a second gear mechanism for selectively engaging the UHF fine tuning cams and the fine tuning elements of the VHF tuner. A lock out mechanism is provided in the fine tuning mechanism so that only the VHF tuner is tuned when the selector shaft is positioned to receive one of the VHF channels. Finally, apparatus is provided for reducing the effects of the UHF detenting mechanism when VHF channels are being selected to maintain the "feel" of the selector shaft substantially the same regardless of whether a UHF or a VHF channel is being selected.

The other objects and advantages of the present invention will readily be apparent from the following specification and drawings wherein.

Figures 1, 4:
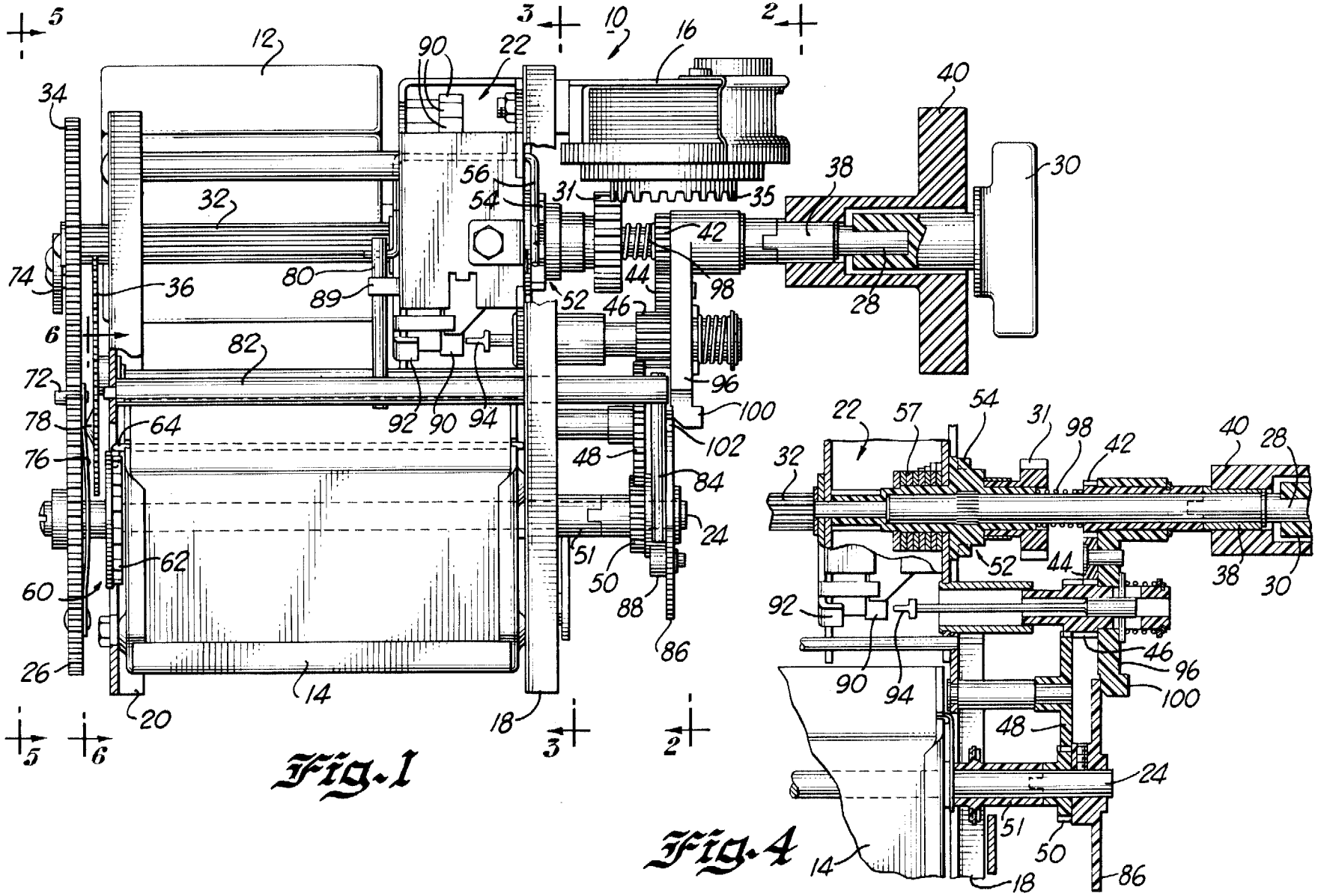
FIG. 1 is a side view of the combination UHF and VHF tuner according to the invention.
FIG. 4 is a detailed side sectional view of the combination tuner according to the invention taken along the line 4—4 of FIG. 3 showing the push-to-engage UHF fine tuning mechanism in its disengaged position.

Referring now to the drawings, with particular attention to FIG. 1, there is shown a combination UHF/VHF television tuner having a UHF tuner 12, a VHF tuner 14 and an indicator dial 16. The UHF tuner 12 and the VHF tuner 14 are standard television tuners mounted to a frame comprising a front plate 18 and a rear plate 20. The UHF tuner 12 is provided with a memory-type fine tuning mechanism 22 similar to the one described in U.S. Pat. application Ser. No. 499,201 filed Aug. 19, 1974, issued to the same inventor and assigned to the same assignee as the assignee of the present invention. The indicator dial 16 is similar to the one described in U.S. Pat. application Ser. No. 257,846 filed May 30, 1972, now U.S. Pat. No. 3,916,820, assigned to the same assignee as the assignee of the present invention. Both of the above references are incorporated hereby by reference.

The VHF tuner 14 has a modified tuning shaft 24 extending from opposite ends of the VHF tuner 14. A gear 26 is attached to the rearwardly extending end of the tuning shaft 24 for rotation therewith. The combination UHF/VHF tuner is tuned by a selector shaft 28 extending through the front plate 18. The forward end of the selector shaft 28 is adapted to receive a selector knob 30 while the other end is affixed to a pinion gear 32. The pinion gear 32 extends through the rear plate 20 and has a gear 34 attached thereto. The gear 34 engages the gear 26, and a third gear 36 engages the teeth of the elongated pinion gear 32.

A fine tuning shaft 38 is mounted concentrically with the selector shaft 28, and a fine tuning knob 40 is employed to rotate the fine tuning shaft 38. The fine tuning shaft 38 drives the UHF fine tuning mechanism by means of three gears 42, 44 and 46 similar to those described in the above-referenced Weigel application Ser. No. 499,201. The VHF fine tuning mechanism is driven by a pair of gears 48 and 50 which are driven by the gear 46. The fine tuning mechanism of the VHF tuning mechanism 14 is a rotate-to-engage memory-type fine tuning mechanism similar to that described in U.S. Pat. No. 3,183,726 issued to Joe G. Badger and assigned to the same assignee as the assignee of the present invention, and incorporated herein by reference.

Both the UHF tuner 12 and the VHF tuner 14 are tunable by means of the single selector shaft 28, rotation of which is effective to turn the gear 34 and the pinion gear 32. The selector shaft 28 also drives the indicator dial 16 through a pair of gears 31 and 35 to provide a numeric indication of the number of the channel being received. The film strip of the indicator described in U.S. application Ser. No. 257,846 is extended and the numbers 2 through 13 are added in similar script so that a unique number between 2 and 83 is displayed for each of the 82 individual channels that can be received by the tuner 10.

The selector shaft 28 is provided with a ten-position detenting mechanism 52 comprising a detent wheel 54 and a detenting spring 56. The detenting mechanism 52 provides 10 detent positions per revolution of the selector shaft 28 to thereby provide 36° of rotation of the gear 34 between detent positions. A stop mechanism 57 limits the range of rotation of the selector shaft 28 to the approximately 8.2 turns necessary to cover the 82 UHF and VHF channels.

The VHF tuning shaft 24 is provided with a 13-position detenting mechanism 60 comprising a detent wheel 62 and a detenting spring 64. The 13 detent positions include one detent position for each of the 12 VHF channels and a detent position wherein the VHF tuner serves as an amplifier for signals received from the UHF tuner 12. As a result, the gear 26 must be made larger than the gear 34 by a 10-to-13 ratio to make the 10 detent positions of the selector shaft 28 compatible with the 13 detent positions of the tuning shaft 24. This is accomplished in the present embodiment by providing the gear 34 with 50 teeth and the gear 26 with 65 teeth.

The UHF tuner 12 is driven directly by means of the selector shaft 28 through a gear reduction mechanism of the type described in the above-identified Weigel application Ser. No. 499,201. The reduction mechanism is driven by the pinion gear 32 which corresponds to gear 30 in the Weigel application. The tuner 12 has a continuously variable tuning shaft (not shown) that is rotatable over a range of approximately one half revolution for covering the 70 UHF channels. A speed reduction ratio of approximately 14-to-1 is provided in the gear reduction mechanism so that the one half revolution of the tuning shaft corresponds to approximately seven revolutions of the selector shaft 28. This permits the 70 UHF channels to be covered by rotating the selector shaft 70 detent positions. An additional range of rotation is built into the tuning shaft of the UHF tuner 12 to permit the selector shaft 28 to be rotated an additional 12 detent positions to cover the 12 VHF television channels.

The VHF television tuner is driven from the rear by means of the gears 26 and 34 attached to the tuning shaft 24 and the selector shaft 28, respectively. In the VHF mode of operation, the gears 34 and 26 are meshed as shown in FIG. 5 and rotation is transferred from the gear 34 to the gear 26 to effect tuning of the VHF television tuner 14.

Figures 5, 6, 7, 8:
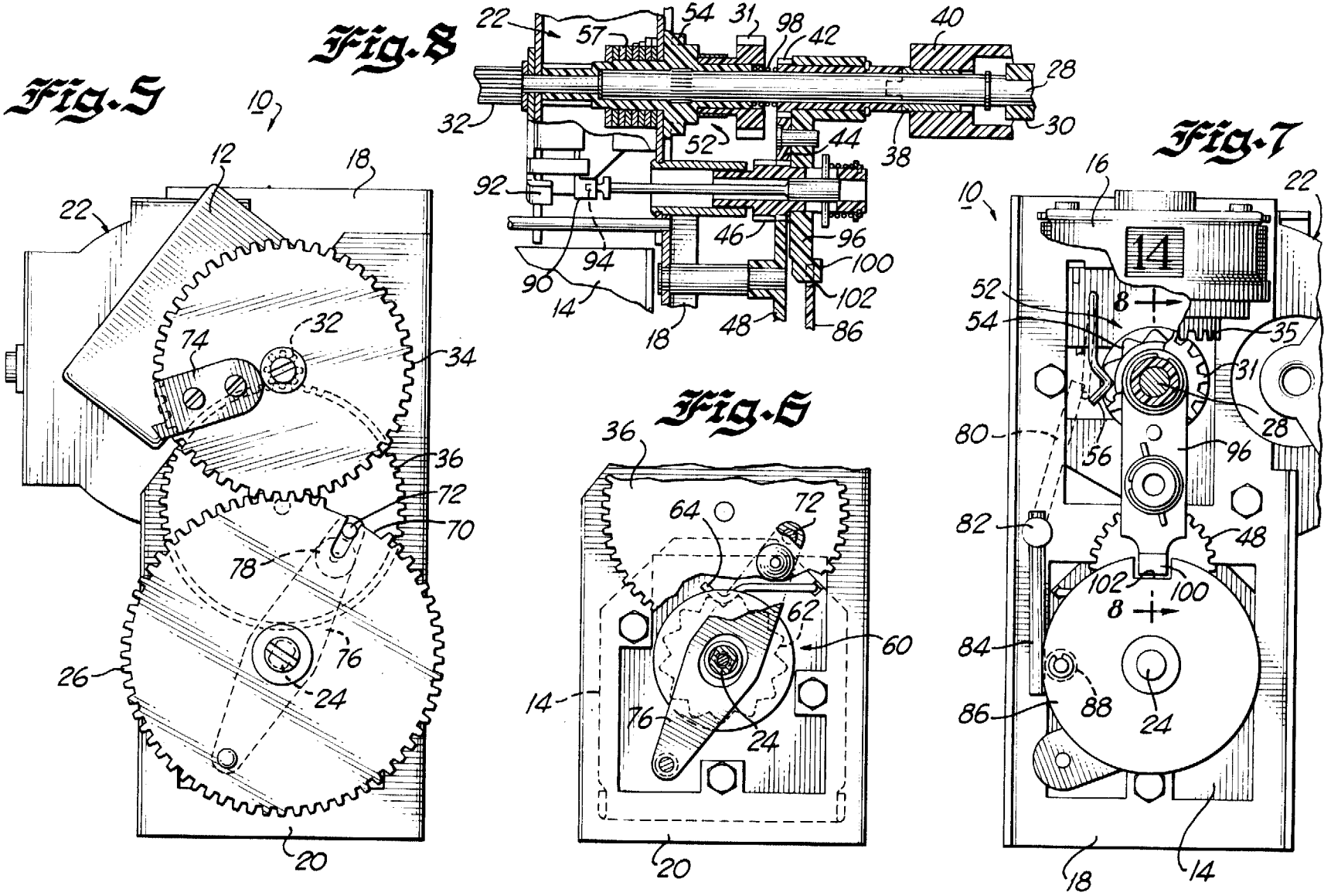
FIG. 5 is a rear view of the combination UHF and VHF tuner taken along the line 5—5 of FIG. 1 and showing the gear mechanism interconnecting the UHF and VHF portions of the combination tuner.
FIG. 6 is a rear sectional view of the combination UHF and VHF tuner taken along the line 6—6 of FIG. 1 showing the gear mechanism and the VHF detenting mechanism in greater detail.
FIG. 7 is a front view similar to FIG. 2 showing the tuner tuned to channel 14 in the UHF band.
FIG. 8 is a side sectional view of the push-to-engage UHF fine tuning mechanism in its engaged position.
Figure 9:
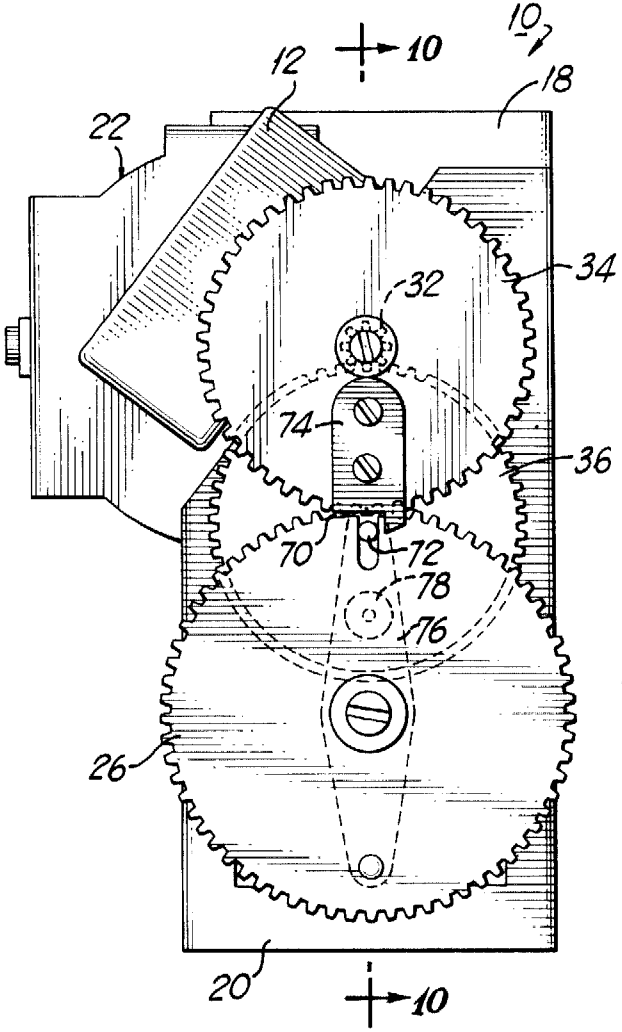
FIG. 9 is a rear view similar to FIG. 5 showing the interconnecting gear mechanism in its disengaged state with the tuner tuned to channel 14 in the UHF band.

For purposes of illustration, the gears 26 and 34 are shown positioned in the channel 2 position in FIG. 5. As the selector shaft 28 is rotated to tune the tuner 14 to the higher numbered channels, the gear 34 is rotated in a counter clockwise direction (when viewed from the rear) and the gear 26 rotates clockwise for slightly less than one revolution until the gear position shown in FIG. 9 is obtained. This position corresponds to the channel 14 position of the selector shaft 28. At this point, further rotation of the gear 34 in the counter clockwise direction will not impart rotary motion to the gear 26 because a gap 70, devoid of teeth, is formed in the periphery of the gear 26 to provide clearance between the gears 26 and 34 when the gap 70 is adjacent the gear 34. Consequently, further rotation of the gear 34 does not affect the position of the gear 26, and only the UHF tuner 12 is tuned by the selector shaft 28.

In order to reengage the gear 26 when it is desired to tune a VHF channel, a spring loaded pin 72 (FIGS. 1, 5 and 9) is provided for engaging an arm member 74 extending beyond the periphery of the gear 34 and over the gear 26. When it is desired to tune the tuner 10 to a VHF channel, the gear 34 is rotated in a clockwise direction by the selector shaft 28 to incrementally tune the UHF tuner 12 through the UHF channels in a descending order of UHF channel numbers until the gear 34 reaches the channel 14 position shown in FIG. 9. Upon rotation of the selector shaft 28 one more increment to the channel 13 position, the pin 72 is engaged by the arm member 74, thereby causing the gear 26 to rotate sufficiently to bring the teeth thereof into mesh with the teeth of the gear 34. The lower numbered VHF channels are then tuned by the now-meshed gears 26 and 34.

The engagement and disengagement of the gears 26 and 34 must occur only at the position of the selector shaft 28 corresponding to the transition between the channels 13 and 14. Because the selector shaft 28, and hence the gear 34, is rotatable over approximately 8.2 revolutions over the range of the UHF and VHF television channels 2 through 83, it is possible for the gears 26 and 34 to become engaged and disengaged at other points besides the transition between the channels 13 and 14. Accordingly, apparatus must be provided for suppressing the engagement of the pin 72 by the arm member 74 at points other than the transition between the channels 13 and 14. This is accomplished by making the pin 72 axially movable with respect to the gear 26 to permit the pin 72 to be retracted sufficiently to prevent it from being engaged by the arm member 74 except when the transition between channels 13 and 14 occurs.

The axial movement of the pin 72 is provided by mounting the pin 72 on a resilient pin supporting strip 76 (FIG. 1). The resilient strip 76 may be fabricated from hard copper or any other suitable resilient material. A bias is built into the strip 76 for retracting the pin 72 sufficiently to permit the arm member 74 to clear the top of the pin 72. As a result of the bias built into the strip 76, the pin 72 normally remains in its retracted position and cannot be engaged by the arm 74.

Figure 12:
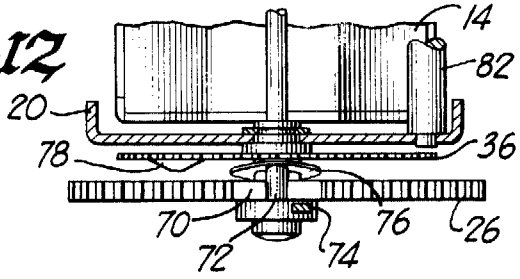
FIG. 12 is a top sectional view of the gear mechanism taken along the line 12—12 of FIG. 11.
Figure 11:
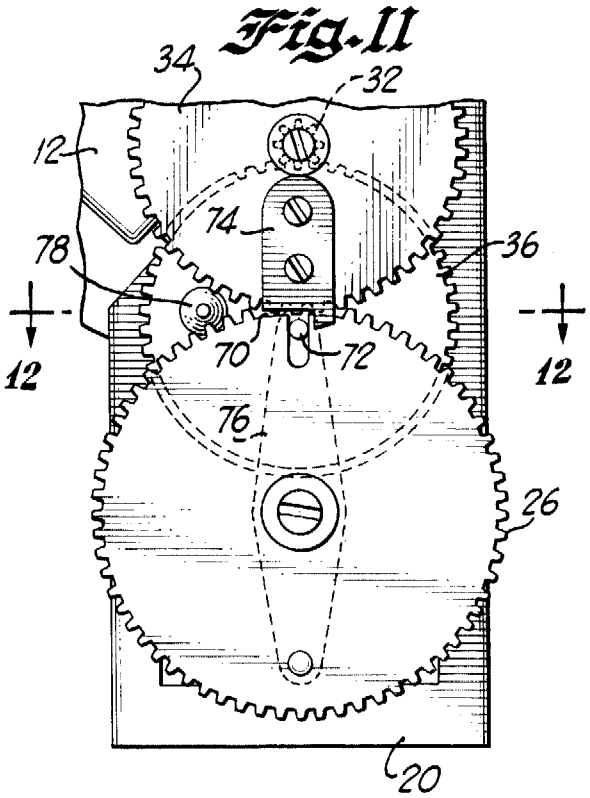
FIG. 11 is a rear view similar to FIGS. 5 and 9 showing the interconnecting gear mechanism rotated to another channel in the UHF band.
Figure 10:
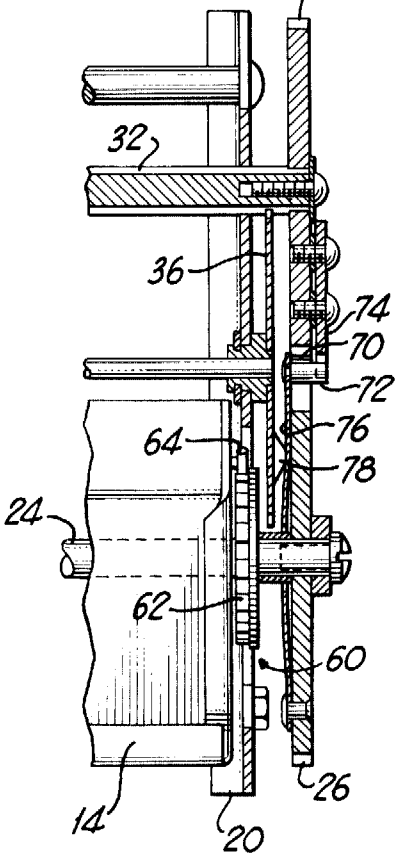
FIG. 10 is a side sectional view of the interconnecting gear mechanism taken along the line 10—10 of FIG. 9.

The pin 72 is extended for engagement by the arm member 74 by means of a rearwardly extending protrusion 78 formed in the gear 36. The gear 36 is driven by the pinion gear 32 and the gear ratio is chosen so that the gear 36 rotates approximately one revolution as the selector shaft 28 is rotated approximately eight revolutions, i.e. over its entire tuning range of the UHF and VHF channels 2 through 83. The rearwardly extending protrusion 78 (best shown in FIGS. 11 and 12) is positioned on the gear 36 so that the protrusion 78 engages the resilient pin supporting strip 76 in the channel 14 position (FIGS. 9 and 10). In this position, the protrusion 78 exerts a rearward pressure against the pin supporting strip 76, thereby causing the pin 72 to be moved axially in the rearward direction an amount sufficient to permit the pin 72 to be engaged by the arm member 74 upon subsequent clockwise rotation of the gear 34 (to the channel 13 position). If the gear 34 is rotated counter clockwise to tune the tuner 10 to higher numbered UHF channels, the gear 36 is rotated by the pinion gear 32 to bring the protrusion 78 out of engagement with the pin supporting strip 76, as shown in FIG. 11. With the protrusion 78 out of engagement with the pin supporting member 76, the pin 72 will be retracted by the member 76 to permit the pin 72 to be cleared by the arm member 74 upon each subsequent counter clockwise rotation of the gear 34. Only when the protrusion 78 is again brought into engagement with the member 76 in the channel 14 position and cams this member rearwardly, can the pin 72 be engaged by the arm member 74.

In accordance with another important feature of the invention, apparatus is provided for reducing the amount of detenting action provided by the UHF detent 52, when the tuner 10 is in the UHF mode. Both the UHF tuner 12 and the UHF tuner 14 have detent mechanisms 52 and 60 defining the channel locations on the selector shaft 28 and the tuning shaft 24, respectively. When the tuner 10 is in the VHF mode, the simultaneous operation of the two detent mechanisms 52 and 60 would require the operator to apply a much greater torque to the selector knob 30 to tune the VHF channels. To avoid this, a mechanism is provided for reducing the detenting force generated by the dententing mechanism 52 when the tuner 10 is operating in the VHF mode. The reduction in detenting action is accomplished by reducing the pressure applied to the detent wheel 54 by the detent spring 56 when a VHF channel is selected.

Figure 3:
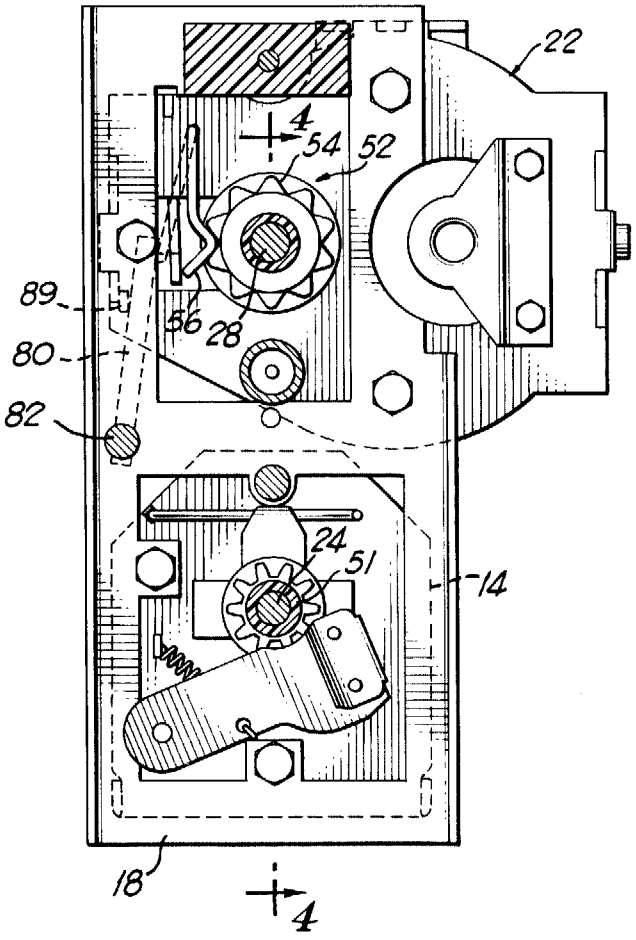
FIG. 3 is a front sectional view of the combination tuner according to the invention taken along the line 3—3 of FIG. 1.
Figure 2:
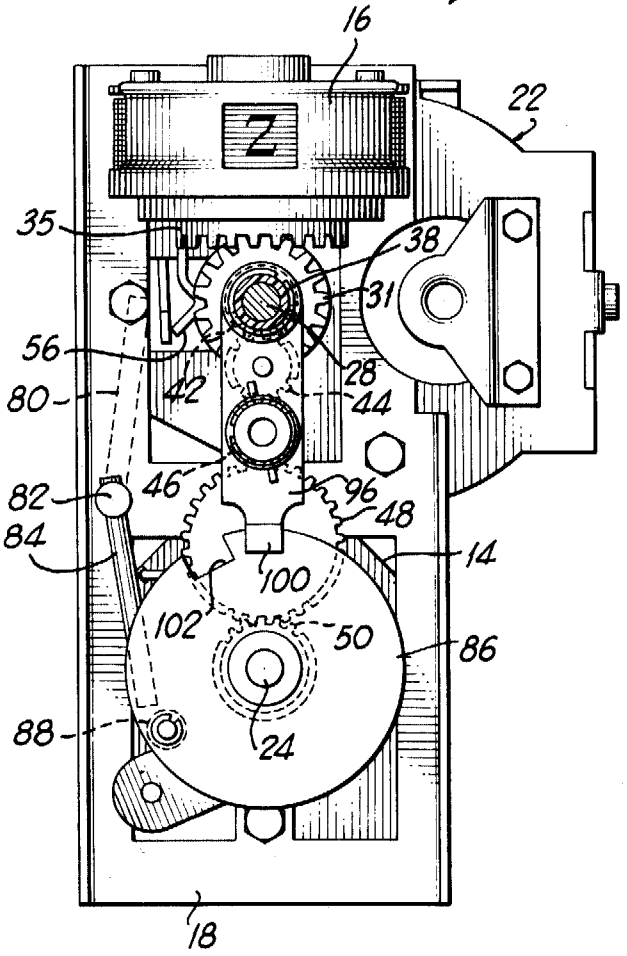
FIG. 2 is a front sectional view of the tuner according to the invention taken along the line 2—2 of FIG. 1, showing the tuner tuned to channel 2 in the VHF band.

Detenting force is exerted on the U-shaped detent spring 56 by means of a rod 80 (FIGS. 1, 3 and 7) that is secured to a pivotally mounted rod 82 and engages one arm of the spring 56. The pivoting rod 82 is supported by the front and rear brackets 18 and 20 and extends forwardly through the front bracket 18. A second rod 84 is attached to the forwardly extending end of the pivoting rod 82 as shown in FIGS. 1, 2 and 7. A cam wheel 86 having a crank pin 88 is affixed to the tuning shaft 24 and rotates therewith, thereby causing the crank pin 88 to engage the rod 84 when the tuner 10 is in the UHF mode.

In the UHF mode, with the VHF tuning shaft 24 positioned as shown in FIGS. 7, 9 and 11, the cam wheel 86 is positioned with the crank pin 88 in engagement with the rod 84. The engagement of the rod 84 by the crank pin 88 causes a torsional force to be applied to the pivoting rod 82, thereby causing the rod 80 to exert a biasing pressure on the detent spring 56 to increase the detent force on the selector shaft 28, provided by the detenting mechanism 52. This is necessary because in the UHF mode, all of the detenting force must be provided by the detenting mechanism 52. However, when the tuner 10 is tuned to one of the VHF stations, the detenting mechanism 60 also generates a detenting force which is applied to the selector shaft 28 through the gears 26 and 34. Consequently, the amount of detent force generated by the detenting mechanism 52 must be reduced. The reduction in detenting force is achieved by rotating the cam wheel 86 with the VHF tuning shaft 24 to bring the crank pin 88 out of engagement with the rod 84 when the VHF tuning shaft 24 is rotated to any position other than the UHF position. This reduces the pressure on the rod 84 (FIG. 2) and permits the detenting spring 56 to force the rod 80 back against a limit stop 89 (FIG. 1). The detenting force generated by the detenting mechanism 52 is thereby substantially reduced to a value determined by the position of the limit stop 89. As a result, the force necessary to turn the selector knob between detent positions in the UHF and VHF modes remains substantially constant.

In accordance with another important feature of the present invention, the cam wheel 86 provides a means to prevent the fine tuning of the UHF tuner 12 when the tuner 10 is operating in a VHF mode and a VHF fine tuning operation is desired. In the embodiment shown in the drawings, the UHF fine tuning system is a push-to-engage fine tuning system and the VHF fine tuning system is a turn-to-engage fine tuning system similar to the type described in the referenced Badger U.S. Pat. No. 3,183,726. The tuner 14 in the present embodiment is a turret type tuner having a separate fine tuning adjusting member for each of the VHF channels. When the VHF tuning shaft 24 of the VHF tuner 14 is in the UHF position, all of the fine tuning adjusting members are out of engagement with the fine tuning mechanism, and consequently, any rotation of the tuning shaft 51 by the gears 42, 44, 46, 48 and 50 does not affect the fine tuning of any of the VHF channels. Therefore, no provision for preventing the fine tuning of the VHF tuner 14 during the operation of the tuner 10 in its UHF mode is necessary.

The fine tuning mechanism employed to fine tune the UHF tuner 12 is similar to the mechanism described in the above-identified Weigel application, and employs a plurality of cams 90 mounted on a rotatable turret for sequentially adjusting a fine tuning cam follower 92. The cam turret is rotated by a ring gear (not shown), similar to the gear 36 in the Weigel application which engages the pinion gear 32. Rotation of the selector shaft 28 sequentially brings each one of the cams 90 into engagement with the cam follower 92 and maintains each cam in engagement with the cam follower 92 for a predetermined number of detent positions (e.g. 3 to 5) to provide a memory type fine tuning mechanism wherein each predetermined group of adjacent channels (e.g. 3 and 5) shares a single one of the fine tuning cams 90.

That one of the fine tuning cams 90 which is in engagement with the cam follower 92 is engageable for rotation thereof by a cam driving member 94. The cam driving member 94 is rotated by the fine tuning shaft 38 through the gear train including the gears 42, 44 and 46. The gears 42, 44, and 46 are attached to a gear supporting member 96 which is slidingly mounted over the selector shaft 28. A resilient biasing spring 98 exerts a forwardly directed pressure on the gear supporting member 96 to normally maintain the cam driving member 94 out of engagement with the cams 90. The cams 90 are engaged by applying a rearwardly directed axial pressure to the fine tuning knob 40 to overcome the pressure from the resilient biasing spring 98 and to move the gear supporting member 96 rearwardly a sufficient amount to bring the cam driving member 94 into engagement with the head of one of the cams 90 (FIG. 8).

Because excess travel must be built into the tuning shaft of the UHF tuner 12 to permit the 12 extra detent positions required for the 12 VHF channels, the cam turrent and the cams 90 continue to rotate even when the tuner 10 is in the VHF mode. Consequently, depressing the fine tuning knob 40 when the tuner 10 is operating in the VHF mode would permit one or more of the cams 90 to be adjusted. If one of these cams had been previously used to fine tune a UHF channel in the area, such a readjustment would destroy the "memorized" fine tuning information for that channel, and result in that UHF channel being received in a detuned condition when selected again. Consequently, the camming wheel 86 is made a sufficiently large diameter to engage an extension 100 of the gear supporting member 96 (FIGS. 1, 2 and 4) to prevent the supporting member 96 from being moved rearwardly a sufficient amount to permit the member 94 to engage the cams 90 when the tuner 10 is operating the VHF mode.

Upon rotation of the VHF tuning shaft 24 to the common UHF position, the camming wheel 86 is rotated to the position shown in FIG. 7 to align the extension 100 with a notch 102 formed in the camming wheel 86. This permits the extension 100 to enter the notch 102 (FIGS. 6 and 7) when the tuner 10 is operating in the UHF mode, thereby permitting the engagement and adjustment of the cams 90 by the cam driving member 94. Because the gear 26 is out of engagement with the gear 34 when the tuner 10 is in the UHF mode, the camming wheel 86 is maintained stationary when the UHF channels are being tuned. As a result, the extension 100 remains in alignment with the notch 102 as long as any one of the UHF channels is being received, thereby permitting the individual adjustment of each of the cams 90. When the tuner 10 is operating in the VHF mode, the camming wheel rotates, but because of its large diameter, the camming wheel 86 engages the extension 100 to prevent the fine tuning of the UHF tuner 12 regardless of the position of the camming wheel 86.

While certain preferred embodiments of the invention have been described by way of illustration, many modifications will occur to those skilled in the art; it will be understood, of course, that it is not desired that the invention be limited thereto, since modifications may be made, and it is, therefore, contemplated by the appended claims to cover any such modifications as fall within the true scope and spirit of the invention.

What is claimed as new and desired to be secured by Letters Patent of the United States is:

1. A combination tuner comprising:

a first tuner tunable over a first predetermined frequency band;

a second tuner tunable over a second predetermined frequency band;

a selector shaft; and means coupling said selector shaft to said first and second tuners, said coupling means including means for operatively coupling said selector shaft to said first tuner over a predetermined range of rotation of said selector shaft for tuning said first tuner over the entire first predetermined frequency band and for operatively coupling said selector shaft to said second tuner for a second predetermined range of rotation of said selector shaft for tuning said second tuner over said entire second predetermined frequency band, said coupling means including a first gear rotatable by said selector shaft, a second gear coupled to one of said tuners and engaging said first gear, means for disengaging said first and second gears and a third gear rotatable by said selector shaft, said third gear having means associated therewith for rendering said disengaging means operative to disengage said first and second gears only in a single predetermined position of said selector shaft, wherein said disengaging means includes an arm member affixed to one of said first and second gears and a retractable pin member affixed to the other one of said first and second gears, said thrid gear being operative to extend and retract said retractable pin.

2. A combination tuner as recited in claim 1 wherein each of said tuners includes a fine tuning mechanism, said combination tuner further including a fine tuning shaft and means responsive to the rotation of said selector shaft for rendering said fine tuning shaft operative to tune the fine tuning mechanism of said first tuner when said selector shaft is operatively coupled to said first tuner, and for rendering said fine tuning shaft operative to tune said second fine tuning mechanism when said selector shaft is operatively coupled to said second tuner.

3. A combination tuner as recited in claim 1 wherein each of said first and second predetermined frequency bands is divided into a predetermined number of channels each channel having a unique number assigned thereto, said tuner further including channel indicator means for sequentially displaying the unique channel numbers of all of the channels in said first and second predetermined frequency bands in response to the rotation of said selector shaft.

4. A combination tuner as recited in claim 2 wherein each of said fine tuning mechanisms is a memory type fine tuning mechanism.

5. A combination tuner as recited in claim 4 wherein one of said fine tuning mechanisms includes a plurality of memory members, each of said memory members being effective to fine tune a plurality of adjacent channels.

6. A combination tuner as recited in claim 1 wherein one of said tuners is a detent type tuner having a tuning shaft incrementally rotatable between a plurality of detent positions, said combination tuner futher including detenting means effective to define a plurality of detenting positions on said selector shaft and means for reducing the effect of said detenting means during the operation of said detented tuner.

7. A combination UHF and VHF television tuning system comprising:

a VHF television tuner having a detented tuning shaft, each detent of said VHF tuning shaft corresponding to a different one of each of the television channels in the VHF television band, a UHF television tuner having a continuously variable tuning shaft, rotation of said tuning shaft being effective to tune said UHF tuner over the entire UHF television band;

a single selector shaft coupled to said UHF and VHF television tuners, rotation of said selector shaft being effective sequentially to tune said television tuners to all of the UHF and VHF television channels in the UHF and VHF television bands, said selector shaft including detent means for rendering said selector shaft incrementally rotatable over a predetermined number of detent positions equal to the total number of television channels in the UHF and VHF television bands, each of said detent positions uniquely corresponding to one of said UHF and VHF channels; and means for providing at a single location a unique indication of the channel number corresponding to each detent position of said selector shaft.

8. A combination tuning system as recited in claim 7 further including means for fine tuning each of said UHF and VHF tuners and a single fine tuning shaft coupled to said fine tuning means, rotation of said fine tuning shaft being effective to fine tune one of said UHF and VHF television tuners in each detent position of said selector shaft without affecting the indication of the channel number provided by the channel number indication providing means.

9. A combination tuning system as recited in claim 8 wherein said fine tuning means is a memory type fine tuning means.

10. A combination tuning system as recited in claim 9 wherein said memory type fine tuning means includes a plurality of memory members, [and] wherein first predetermined ones of said memory members are effective to fine tune said VHF television tuner, each of said first predetermined ones of said memory members being operative to tune said VHF tuner only when said selector shaft is positioned in a single predetermined one of the detent positions of said selector shaft, and wherein [said] second predetermined ones of said memory members are effective to fine tune said UHF television tuner when said selector shaft is positioned within a predetermined range of rotation thereof corresponding to a plurality of adjacent detent positions of said selector shaft.

11. A combination tuning system as recited in claim 8 wherein said fine tuning shaft is axially movable over a predetermined range, and wherein said VHF television channels are fine tuned by rotating said [selector] *fine tuning* shaft in a first axial position, and said UHF television channels are fine tuned by rotating said fine tuning shaft in a second axial position.

12. A combination tuning system as recited in claim 7 wherein said predetermined number of detent positions is eighty two, including twelve corresponding to the twelve assigned VHF channels and seventy corresponding to the seventy UHF channels.

13. A combination tuning system as recited in claim 7 further including means responsive to the position of said selector shaft for reducing the detenting effect of said detent means when said selector shaft is tuned between those detent positions corresponding to the VHF television stations.

14. A combination tuning system as recited in claim 7 wherein the tuning shaft of the UHF tuner extends in a forward direction and is mechanically coupled to the selector shaft, the tuning shaft of said VHF tuner extends in a rearward direction, and the selector shaft extends through the combination tuning system, wherein the combination tuning system includes means for mechanically coupling the rearwarding extending VHF tuning shaft to a rear portion of the selector shaft.

*15. A combination UHF and VHF television tuning system comprising:*

*a VHF television tuner tunable to each of the television channels in the VHF television band;*

*a UHF television tuner having a continuously variable tuning shaft, rotation of said tuning shaft being effective to tune said UHF tuner over the entire UHF television band;*

*a single selector shaft coupled to said UHF and VHF television tuners, rotation of said selector shaft being*

*effective to tune said television tuners to all of the UHF and VHF television channels in the UHF and VHF television bands, said selector shaft including detent means for rendering said selector shaft incrementally rotatable over a predetermined number of detent positions for selecting each of the channels in the UHF and VHF television bands, each of said detent positions uniquely corresponding to one of said UHF and VHF channels; and*

*means for providing a unique indication of the channel number corresponding to each detent position of said selector shaft.*

*16. A combination tuning system as recited in claim 15 wherein said unique channel number indication providing means includes means for providing said unique indication at a single location.*

*17. A combination tuning system as recited in claim 15 further including means for fine tuning each of said UHF and VHF tuners and a single fine tuning shaft coupled to said fine tuning means, rotation of said fine tuning shaft being effective to fine tune one of said UHF and VHF television tuners in each detent position of said selector shaft without affecting the indication of the channel number provided by said channel number indication providing means.*

*18. A combination tuning system as recited in claim 17 wherein said fine tuning means is a memory type fine tuning means.*

*19. A combination tuning system as recited in claim 18 wherein said memory type fine tuning means includes a plurality of memory members, wherein first predetermined ones of said memory members are effective to fine tune said VHF television tuner, each of said first predetermined ones of said memory means being operative to fine tune said VHF tuner only when said VHF tuner is tuned to a single predetermined one of said VHF television channels, and wherein second predetermined ones of said memory members are effective to fine tune said UHF television tuner, each of said second predetermined ones of said memory members being effective to fine tune said UHF television tuner when said UHF television tuner is tuned to any one of a predetermined plurality of UHF television channels.*

*20. A combination tuning system as recited in claim 19 wherein said memory type fine tuning means includes a rotatable turret mechanically coupled to said selector shaft for rotation thereby, and each of said second predetermined ones of said memory members includes a cam member rotatably mounted to said turret, wherein said tuning system includes means operatively coupled to said fine tuning shaft for selectively engaging one of said cam members for rotation in response to rotation of said fine tuning shaft and cam follower means positioned adjacent to said turret and engageable by said one cam member, each of said cam members being engageable by said selective engaging means in more than one detent position of said selector shaft.*

*21. A combination tuning system as recited in claim 20 wherein said selective engaging means includes a cam driving member disposed adjacent to said one cam member and gear means coupling said fine tuning shaft to said cam driving member for rotating said cam driving member in response to rotation of said fine tuning shaft.*

*22. A combination tuning system as recited in claim 21 further including means coupling said fine tuning shaft to said cam driving member for axially moving said cam driving member in response to axial movement of said fine tuning shaft.*

*23. A combination tuning system as recited in claim 17 wherein said fine tuning shaft is axially movable over a predetermined range, and wherein said VHF television channels are fine tuned by rotating said fine tuning shaft in a first axial position and said UHF television channels are fine tuned by rotating said fine tuning shaft in a second axial position.*

* * * * *